United States Patent
Na et al.

(10) Patent No.: US 9,077,350 B2
(45) Date of Patent: Jul. 7, 2015

(54) DELAY-LOCKED LOOP CIRCUIT AND METHOD OF CONTROLLING THE SAME

(71) Applicant: SAMSUNG ELECTRONICS CO., LTD., Suwon-si, Gyeonggi-do (KR)

(72) Inventors: Tae-Sik Na, Seoul (KR); In-Dal Song, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/212,362

(22) Filed: Mar. 14, 2014

(65) Prior Publication Data

US 2014/0266351 A1    Sep. 18, 2014

(30) Foreign Application Priority Data

Mar. 14, 2013 (KR) .................. 10-2013-0026990

(51) Int. Cl.
*H03L 7/06* (2006.01)
*H03L 7/081* (2006.01)
*H03L 7/095* (2006.01)
*G11C 7/22* (2006.01)

(52) U.S. Cl.
CPC ............ *H03L 7/0812* (2013.01); *H03L 7/0818* (2013.01); *H03L 7/095* (2013.01); *G11C 7/222* (2013.01)

(58) Field of Classification Search
None
See application file for complete search history.

(56) References Cited

U.S. PATENT DOCUMENTS

| | | | |
|---|---|---|---|
| 7,034,590 B2 | 4/2006 | Shin | |
| 7,271,634 B1 | 9/2007 | Daga et al. | |
| 7,928,782 B2 * | 4/2011 | Booth et al. | 327/158 |
| 8,125,254 B1 * | 2/2012 | Ding | 327/156 |
| 8,169,242 B2 * | 5/2012 | Abbasi et al. | 327/156 |
| 2008/0112526 A1 | 5/2008 | Yi | |
| 2010/0039148 A1 | 2/2010 | Petrie | |
| 2010/0123495 A1 | 5/2010 | Kobayashi et al. | |
| 2010/0213991 A1 | 8/2010 | Fukuda | |
| 2010/0213995 A1 | 8/2010 | Lee | |
| 2012/0306551 A1 * | 12/2012 | Moon et al. | 327/149 |
| 2013/0003483 A1 * | 1/2013 | Vlasenko et al. | 365/230.02 |
| 2014/0002155 A1 * | 1/2014 | Park et al. | 327/158 |
| 2014/0021990 A1 * | 1/2014 | Na | 327/158 |

* cited by examiner

*Primary Examiner* — Cassandra Cox

(74) *Attorney, Agent, or Firm* — Lee & Morse, P.C.

(57) ABSTRACT

A delay-locked loop circuit includes a phase detector and a coarse-lock detector. The phase detector receives a feedback clock and a first clock to generate first and second phase detecting signals, respectively. The coarse-lock detector generates a coarse-lock signal based on changes of phase of the first and second phase detecting signals.

18 Claims, 7 Drawing Sheets

DELAY-LOCKED LOOP CIRCUIT AND METHOD OF CONTROLLING THE SAME

CROSS-REFERENCE TO RELATED APPLICATION

Korean Patent Application No. 10-2013-0026990, filed on Mar. 14, 2013, and entitled "Delay-Locked Loop Circuit and Method of Controlling The Same," is incorporated by reference herein in its entirety.

BACKGROUND

1. Field

One or more embodiments herein relate to a delay-locked loop circuit.

2. Description of the Related Art

One type of memory that has been developed is known as a Double Data Rate Synchronous Dynamic Random Access Memory (DDR SDRAM). Such a memory performs an ODT (On-Die Termination) operation to read data in synchronization with an external clock or to vary a termination resistance value. A delay-locked loop (DLL) circuit has been used to control the clock synchronization operation. A DLL having a coarse-fine architecture has been extensively used to improve a DLL lock time.

A DDR4 SDRAM has an operation range of 1.6 GT/s to 3.2 GT/s and has an operation voltage of 1.2 V or less. Under the above condition, quality degradation in an input clock may have a pronounced effect on overall operation of the DLL. An example of such quality degradation is coarse-lock failure due to jitter of the input clock.

SUMMARY

In accordance with one embodiment, a delay-locked loop circuit includes a phase detector to receive a feedback clock and a first clock to generate first and second phase detecting signals, respectively; and a coarse-lock detector to generate a coarse-lock signal based on changes of phase of the first and second phase detecting signals, wherein the phase changes include a change from in-phase state to an out-of phase state.

The delay-locked loop circuit may include a divider to divide a reference clock by a value of N, wherein the first clock is generated based on the divided reference clock and wherein N is an integer equal to or greater than 1.

The phase detector may include a first phase detector to generate the first phase detecting signal according to a level of the first clock at a front end of the feedback clock; a first delay circuit to generate a first delayed feedback signal by delaying the feedback clock for a first delay time; and a second phase detector to generate the second phase detecting signal according to the level of the first clock at a front end of the first delayed feedback clock.

The coarse-lock detector may include a phase change detector to detect a time point at which phases of the first and second phase detecting signals are changed from in-phase to out-of phase at a front end of a second delayed feedback signal; and a signal latch to generate the coarse-lock signal by latching the time point of the phase change.

The phase change detector may include an exclusive OR circuit that detects out-of phase intervals of the first and second phase detecting signals; and a D flip-flop that detects a level of an output signal of the exclusive OR circuit at the front end of a second delayed feedback signal.

The phase detector may include a first phase detector to generate the first phase detecting signal according to a level of the first clock at a front end of the feedback clock; and a second phase detector to generate the second phase detecting signal according to a level of the first phase detecting signal at the front end of the feedback clock.

The coarse-lock detector may include an in-phase detector to detect whether phases of the first and second phase detecting signals are an in-phase at a front end of a feedback signal; and a signal latch to generate the coarse-lock signal by latching an in-phase detecting time of the in-phase detector.

The in-phase detector may include an exclusive NOR circuit that detects in-phase intervals of the first and second phase detecting signals; and a D flip-flop that detects a level of an output signal of the exclusive XOR circuit at the front end of a feedback unit.

In accordance with another embodiment, a method of controlling a delay-locked loop circuit includes receiving a feedback clock and a first clock to generate first and second phase detecting signals, respectively; and generating a coarse-lock signal based on detecting changes of phase of the first and second phase detecting signals, wherein the changes of phase include a change from in-phase to out-of phase.

The method may include dividing a reference clock by a value N, wherein the first clock is based on the divided reference clock and wherein N is an integer of 1 or more.

Generating the first and second phase detecting signals may include generating the first phase detecting signal according to a level of the first clock at a front end of the feedback clock; generating a first delayed feedback signal by delaying the feedback clock for a first delay time; and generating the second phase detecting signal according to the level of the first clock at a front end of the first delayed feedback clock.

Generating the coarse-lock signal may include detecting a time point at which the phases of the first and second phase detecting signals change from in-phase to out-of phase at a front end of a second delayed feedback signal; and generating the coarse-lock signal by latching the time point of the changes of phase.

Detecting the time point may include detecting out-of phase intervals of the first and second phase detecting signals; and detecting a level of an output signal of the exclusive OR circuit at the front end of a second delayed feedback signal.

Generating the first and second phase detecting signals may include generating the first phase detecting signal according to a level of the first clock at a front end of the feedback clock; and generating the second phase detecting signal according to a level of the first phase detecting signal at the front end of the feedback clock.

Generating the coarse-lock signal may include detecting whether phases of the first and second phase detecting signals are in-phase at a front end of a feedback signal; and generating the coarse-lock signal by latching an in-phase detecting time.

In accordance with another embodiment, a delay-locked loop circuit includes a phase detector to generate a first signal and a second signal based on a divided reference clock signal and a third signal based on a feedback clock signal, the first signal to be generated at a time different from the second signal; a delay circuit to delay the feedback clock signal at least once; and a coarse-lock detector to generate a coarse-lock signal based on the first and second signals and the delayed feedback clock signal relative to a timing of the divided reference clock signal.

The coarse-lock detector may generate the coarse-lock signal based on changes of phase of the first and second signals. The changes of phase may correspond to a change from in-phase state to out-of phase state.

The phase detector may include a first flip-flop having an input coupled to receive the divided reference clock signal, the first flip-flop to output the first signal based on the feedback clock signal; and a second flip-flop having an input coupled to receive the divided reference clock signal, the second flip-flop to output the second signal based on the delayed feedback clock signal.

The delay circuit may delay the delayed feedback clock signal and the coarse-lock detector may generate the coarse-lock signal based on a timing that corresponds to an output of the delay circuit.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
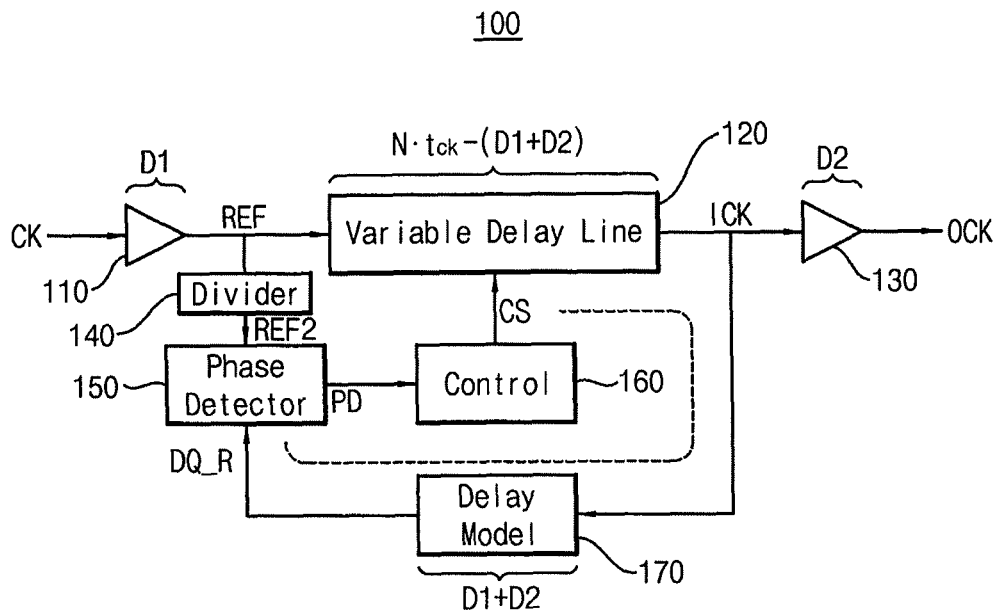
FIG. 1 illustrates an embodiment of a DLL circuit.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a DLL circuit 100 which includes an input buffer 110, a variable delay line 120, an output buffer 130, a divider 140, a phase detector 150, a controller 160, and a delay model block 170.

The input buffer 110 receives an external clock CK to generate a reference clock REF having a delay characteristic D1.

The variable delay line 120 controls a delay amount of the reference clock REF to generate an internal clock ICK having a delay characteristic which may be expressed as $N \cdot t_{CK} - (D1 + D2)$. The parameter $t_{CK}$ is one time period of an external clock CK, and N is an integer greater than D1+D2.

The output buffer 130 outputs data having a delay characteristic D2 in synchronization with the internal clock ICK.

The divider 140 divides the reference clock REF by N-division (integer equal to or greater than 1) to generate a first clock REF2. In one illustrative embodiment, the divider performs 2-divides on the reference clock.

The phase detector 150 receives a feedback clock DQ_R and the first clock REF2 to output a phase detection signal PD.

The controller 160 generates a delay control signal CS for input into the variable delay line 120 in response to a phase detection signal PD.

The delay model block 170 delays the internal clock ICK by a delay characteristic D1+D2. This delay characteristic may be obtained, for example, by replicating delay characteristics of an input buffer 110 and an output buffer 130 to generate the feedback clock DQ_R.

In one embodiment, the variable delay line 120 may include a coarse delay line and a fine delay line. Further, the controller 160 may include a coarse controller and a fine controller.

Figure 2:
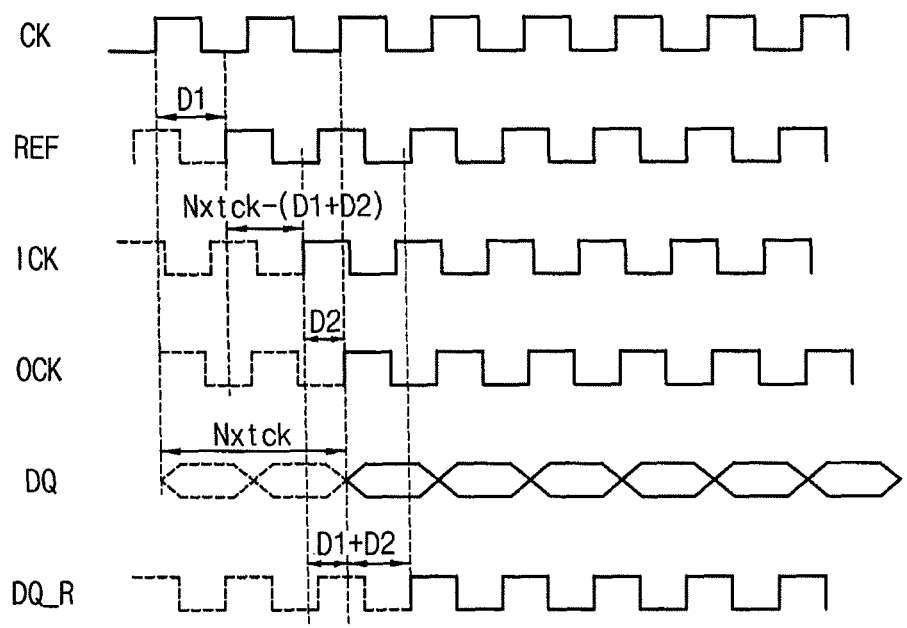
FIG. 2 illustrates an example of a timing diagram for the DLL circuit.

FIG. 2 illustrates an example of a timing diagram for operating the DLL circuit shown in FIG. 1. Referring to FIG. 2, a clock CK is delayed by D1 while passing through an input buffer 110 and is delayed by D1 to produce a reference clock REF. The reference clock REF is delayed by $N \cdot t_{CK} - (D1 + D2)$ while passing through the variable delay line 120, to produce an internal clock ICK. The internal clock ICK is delayed by D2 while passing through the output buffer 130, to produce a playback clock. The playback clock OCK is delayed by two periods (N=2) as compared with the clock CK, but has the same phase as that of the clock CK.

That is, since the clock CK has a delay characteristic of D1+D2 on a path from an input to an output, a feedback clock DQ_R can be generated by modeling the clock CK in the delay model block 170. If a phase is detected by inputting a feedback clock DQ_R and a reference clock REF, coarse-lock failure may occur due to jitter.

Figure 3:
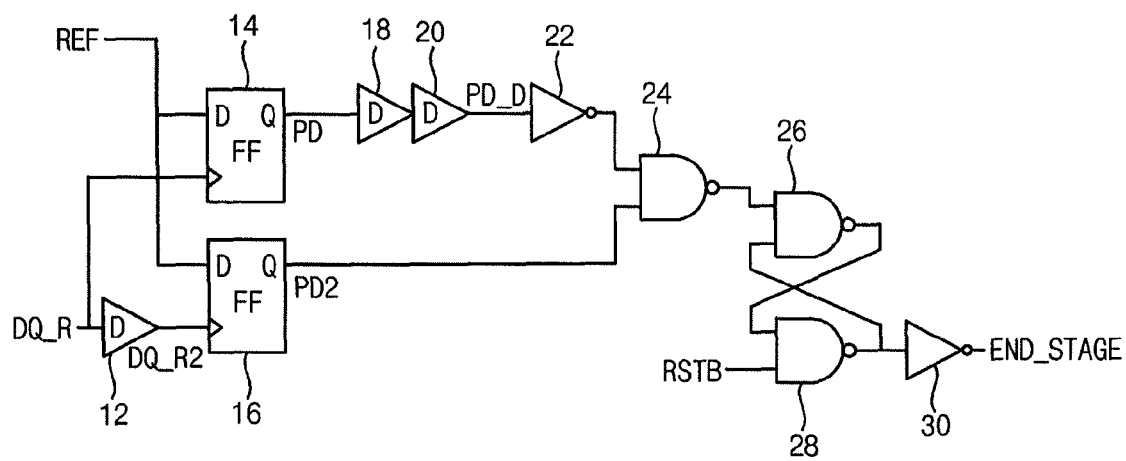
FIG. 3 illustrates one type of coarse-lock detecting that has been proposed.

FIG. 3 illustrates one type of coarse-lock detecting circuit that has been proposed. Referring to FIG. 3, the coarse lock detecting circuit 10 includes delay units 12, 18, and 20, D flip-flops 14 and 16, inverters 22 and 30, and NAND gates 24, 26, and 28. The delay unit 12 determines a coarse-lock window width, that is, WINDOW=DQ_R−DQ_R2=$(t_{CK}/2) - \alpha$.

Figure 4:
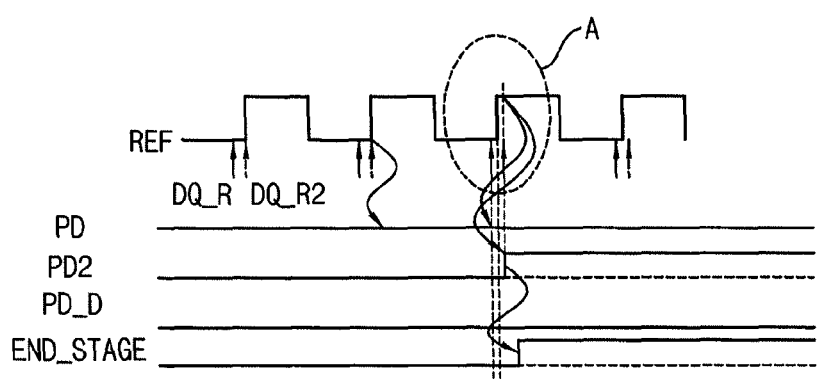
FIG. 4 illustrates a timing diagram for performing the coarse-lock detecting in FIG. 3 in an update state smaller than a coarse-lock window.

FIG. 4 is a timing diagram illustrating operation of the coarse-lock detecting circuit of FIG. 3 in an update state smaller than a coarse lock window. Referring to FIG. 4, since the reference clock REF and the feedback clock DQ_R have the same frequency, a frond end of the reference clock REF is compared with a front end of the feedback clock DQ_R. The flip-flop 14 outputs a level state of the reference clock REF at a front end of the feedback clock DQ_R as a phase detecting signal PD.

Since the front end of the feedback clock DQ_R always precedes the front end of the reference clock REF in a coarse-lock state, the phase detecting signal PD remains at a low logic level. The flip-flop 16 outputs a level state of the reference clock REF at a front end of the delayed feedback clock DQ_R2 as a phase detecting signal PD2.

Accordingly, if a delay amount is updated through a variable delay line so that a coarse-lock state is present in area A, the front end of the delayed feedback clock DQ_R2 is placed behind the front end of the reference clock REF. As a result, the phase detecting signal PD2 transitions from a low level to a high level in the coarse-lock state. A high level signal is always applied to an input terminal of the NAND gate 24 through the inverter 22. Accordingly, when the phase detecting signal PD2 is changed to a high level state, an output signal of the NAND gate 24 becomes a low level. A low level is latched in a latch circuit of the NAND gates 26 and 28. An output of the latch circuit is output through the inverter 30 as a coarse lock signal END_STAGE.

Figure 5:
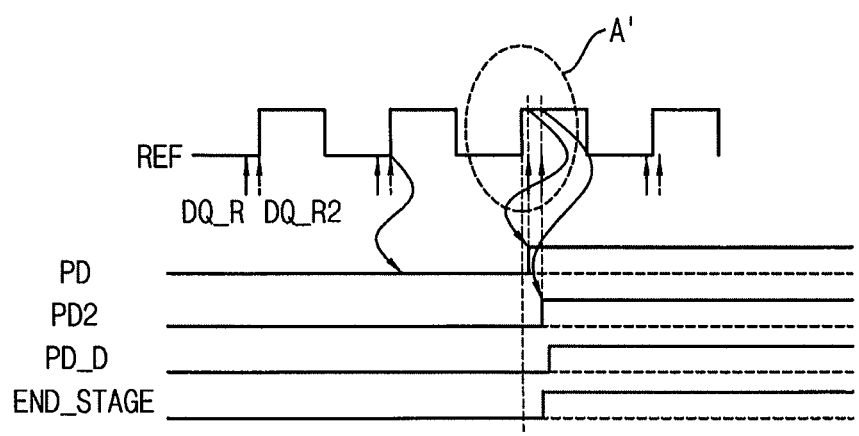
FIG. 5 illustrates a timing diagram for performing the coarse-lock detecting in FIG. 3 in an update state larger than a coarse-lock window.

FIG. 5 illustrates a timing diagram for operating the coarse-lock detecting circuit of FIG. 3 in an update state larger than a coarse lock window. Referring to FIG. 5, when an update value is greater than a coarse-lock window width, the front end of the feedback clock DQ_R is placed behind the front end of the reference clock REF and the phase detecting signal PD is changed from a low level to a high level. However, the phase detecting signal PD_D is delayed by the delay units 18 and 20 more than the coarse-lock window width. Accordingly, an output of the NAND gate 24 latched to the lath circuit transitions to a high level so that the coarse-lock signal is stably generated.

Figure 6:
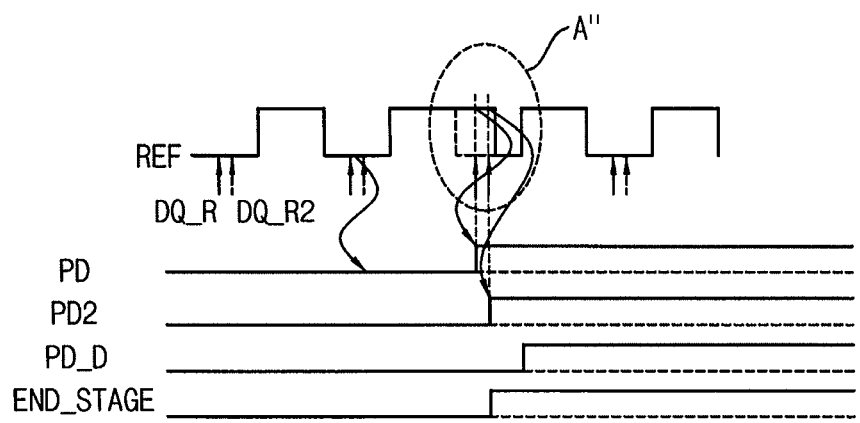
FIG. 6 illustrates a timing diagram for FIG. 3 when jitter occurs at a rear end of a reference clock.

FIG. 6 is a timing diagram illustrating the operation of the detecting circuit of FIG. 3 when jitter occurs at a rear end of a reference clock REF. Referring to FIG. 6, if jitter occurs at a rear end of the reference clock REF in area A, a pulse width is increased so that a rear end of the reference clock REF is delayed more than the feedback clock DQ_R and the delayed feedback signal DQ_R2. In this case, an undesirable coarse lock signal may be generated and coarse-control failure of a DLL loop may occur.

In accordance with the following example embodiments, coarse-lock failure due to jitter is reduced or altogether eliminated.

Figure 7:
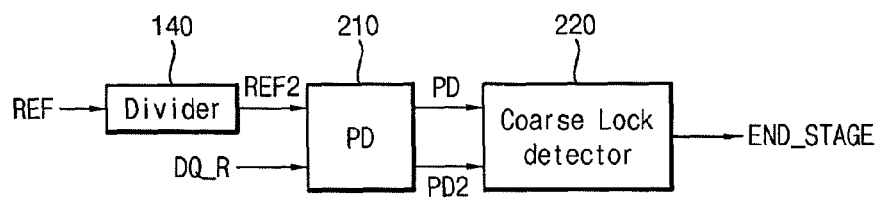
FIG. 7 illustrates an embodiment of a coarse-lock detecting circuit.

FIG. 7 illustrates an embodiment of a coarse-lock detecting circuit 200 of a DLL circuit, such as shown, for example, in FIG. 1. Referring to FIG. 7, a coarse-lock detecting circuit 200 includes a phase detector 210 and a coarse lock detector 220.

The phase detector 210 receives a feedback clock DQ_R and a first clock REF2 to generate first and second phase detection signals PD and PD2, respectively. The coarse-lock detector 220 detects change of a phase of the first phase detecting signal PD and a phase of the second phase detecting signal PD2 from in-phase to out-of phase, to generate a coarse-lock signal END_STAGE. As shown in FIG. 1, the first clock REF2 is a clock obtained by dividing the reference clock REF by two using the divider 140.

Figure 8:
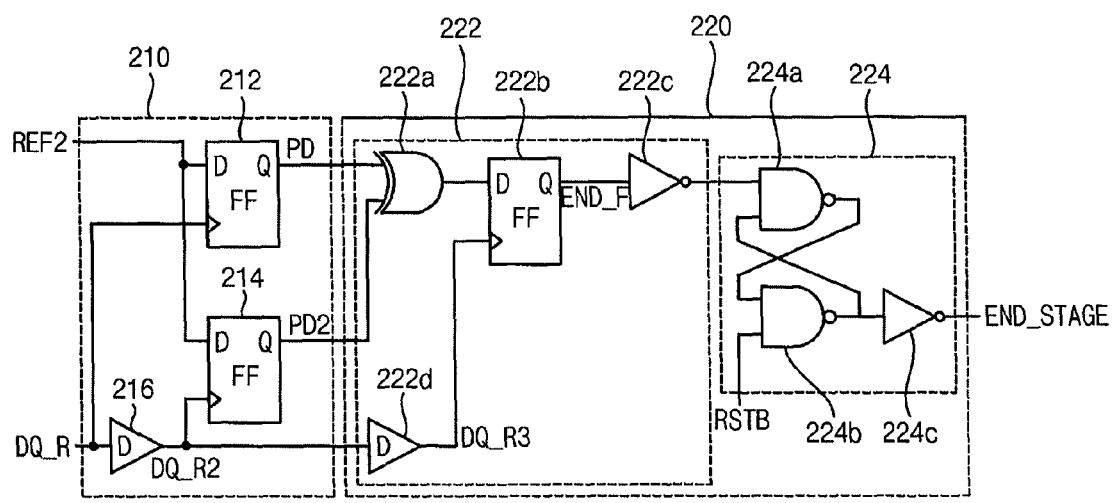
FIG. 8 illustrates a first example embodiment of a coarse-lock detecting circuit.

FIG. 8 illustrates a circuit diagram corresponding to a first example embodiment of a coarse-lock detecting circuit such as shown in FIG. 7. Referring to FIG. 8, a phase detector 210 includes a first phase detector 212, a second phase detector 214, and a delay unit 216. The phase detector 210 is different from the phase detector in FIG. 3. For example, according to one difference, the phase detector 210 uses the divided first reference clock REF2 instead of the reference clock REF.

The first phase detector 212 may be configured, for example, by a D flip-flop. The first phase detector 212 generates a first phase detecting signal PD according to a level of a first clock REF2 at an end of the feedback clock DQ_R. That is, the first phase detector 212 compares the phase at the front end and the rear end of the first clock REF2 with the phase of the feedback clocks DQ_R. The delay unit 216 generates a first delayed feedback clock DQ_R2 by delaying the feedback clock DQ_R by a first delay time.

The second phase detector 214 generates a second phase detecting signal PD_D according to a level state of a first clock at the front end of the first delayed feedback clock DQ_R2. That is, the first and second phase detector 212 and 214 are different from the phase detector in FIG. 3, in that the first phase detector 212 and the second phase detector 214 compare the phase of the feedback clock DQ_R with the phase of the first delayed feedback clock DQ_R2 at the front end and the rear end of the first clock REF2.

The coarse-lock detector 220 includes a phase change detector 222 and a signal latch unit 224. The phase change detector 222 includes an exclusive OR circuit 222a (that is, an XOR gate) a D flip-flop 222b, an inverter 222c, and a delay unit 222d. The phase change detector 222 detects a time point when phases of the first and second phase detecting signals PD and PD2 are changed from in-phase to out-of phase. The signal latch unit 224 includes NAND gates 224a and 224b and an inverter 224c, and generates a coarse lock signal by latching a phase change time.

Figure 9:
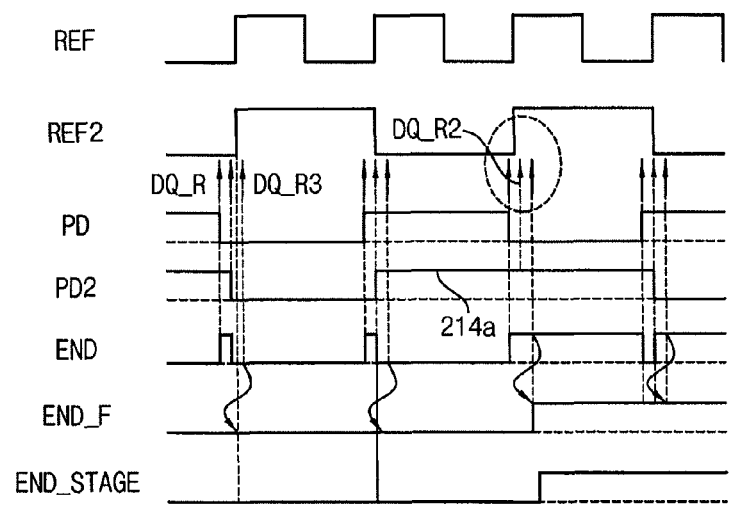
FIG. 9 illustrates a timing diagram for the detecting circuit in FIG. 8.

FIG. 9 is a timing diagram illustrating operation of the coarse-lock detecting circuit shown in FIG. 8. In FIG. 9, the thick solid line arrow represents a front end of the feedback clock DQ_R, a thick dotted line arrow represents a front end of the first delayed feedback clock DQ_R2, and a thin solid line arrow represents the front end of a second delayed feedback clock DQ_R3.

Referring to FIG. 9, phases of feedback clocks DQ_R, DQ_R2, and DQ_R3 are compared with each other at a front end and a rear end of the first clock REF2. Since the first phase detector 212 detects a level of the first clock REF2 at the front end of the feedback clock DQ_R, the first phase detector 212 generates a phase detecting signal PD having an inverted phase and the same frequency as compared with the phase and frequency of the first clock REF2.

Since the second phase detector 214 detects a level of the first clock REF2 at the front end of the feedback clock DQ_R2, the second phase detector 212 generates a phase detecting signal PD2 having an inverted phase and the same frequency as compared with the phase and frequency of the first clock REF2. However, if a front end of the phase detecting signal PD2 is delayed as compared with the front end of the first clock REF2 by update, the phase detecting signal PD2 maintains a level state of a previous period, so the phase detecting signal PD2 has a pulse width 214a of one period longer than a half period of the first clock REF2.

The XOR gate 222a of the phase change detector 222 detects out-of phase intervals of two phase detecting signals PD and PD2 to output an out-of phase detecting signal END. The out-of phase detecting signal END represents phases opposite to each other before and after the coarse lock is performed by update. That is, the two phase detecting signals PD and PD2 maintain in-phase before the coarse lock and maintain out-of phase with inverted phases after the coarse lock.

The flip-flop 222b generates a phase change detecting signal END_F by detecting a level of an output signal of the XOR gate in a front end of the second delayed feedback clock DQ_R3. The phase change detecting signal END_F is output as a coarse-lock signal END_STAGE through the signal latch unit 224.

As described above, since the first example embodiment detects a phase using a first clock REF2 divided from a reference signal REF, influence of jitter is attenuated. In addition, the phase change detection is performed, other than state detection, so a coarse-lock state can be exactly detected without failure.

Figure 10:
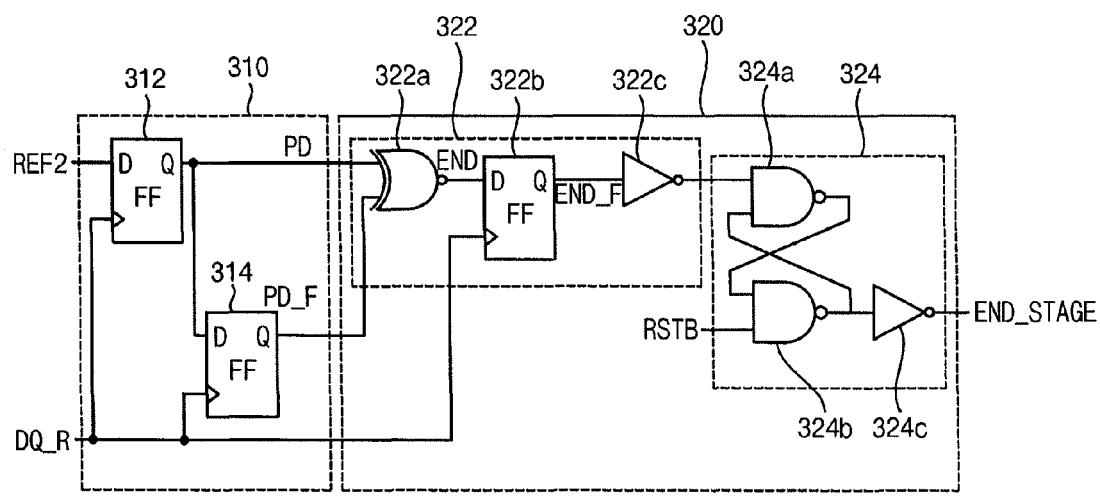
FIG. 10 illustrates a second example embodiment of the coarse-lock detecting circuit.

FIG. 10 is a second example embodiment of the coarse lock detecting circuit 200 shown in FIG. 7. Referring to FIG. 10, a phase detector 310 according to the second example embodiment includes two phase detectors. The first phase detector 312 generates a first phase detecting signal PD according to a level of a first clock REF2 at a front end of a feedback clock DQ_R, and the second phase detector 314 generates a second phase detecting signal PD_F according to a level of the first phase detecting signal PD at the front end of the feedback clock DQ_R. The first phase detector 312 and the second phase detector 314 may be configured, for example, by D flip-flops.

In the second example embodiment, the coarse-lock detector 320 includes an in-phase detector 322 and a signal latch unit 324. The coarse-lock detector 320 detects an in-phase state of the first and second phase detecting signals PD and PD_F at a front end of the feedback signal DQ_R. The signal latch unit 324 generates a coarse-lock signal by latching an in-phase detecting time. In this embodiment, the in-phase detector 322 includes an XNOR gate 322a, a D flip-flop 322b, and an inverter 322c. The signal latch unit 224 includes NAND gates 324a and 324b, and an inverter 324c, and latches an in-phase detecting time to generate a coarse lock signal END_STAGE.

Figure 11:
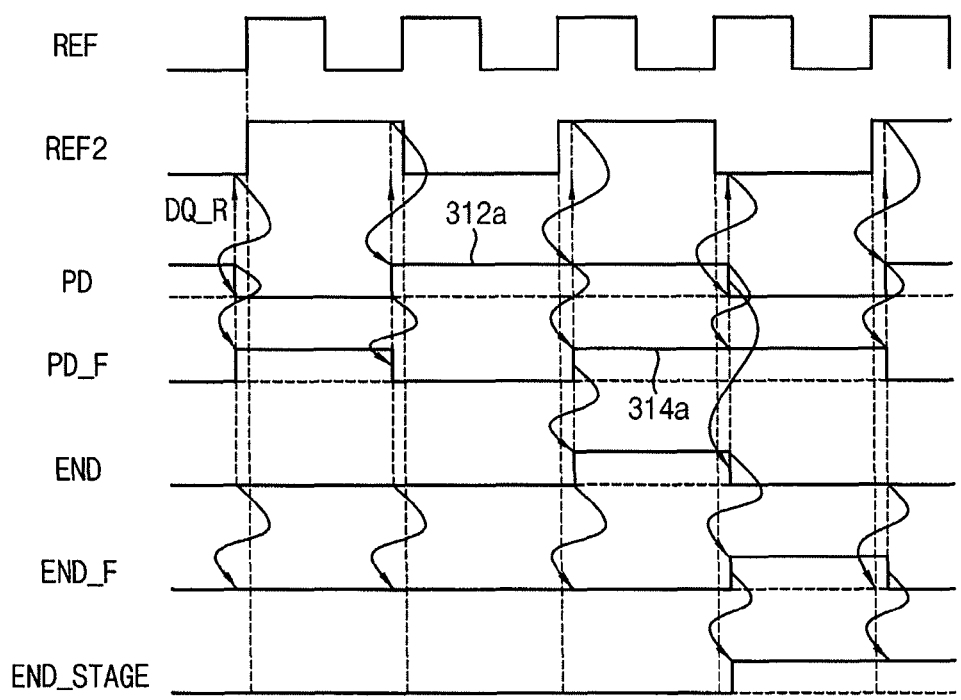
FIG. 11 illustrates a timing diagram for the detecting circuit in FIG. 10.

FIG. 11 is a timing diagram illustrating an operation of the coarse-lock detecting circuit shown in FIG. 10. Referring to FIG. 11, the phase at a front end and a rear end of the first clock REF2 is compared with the phase at an front end of the feedback clock DQ_R. Since the first phase detector 312 detects a level of the first clock REF2 at the front end of the feedback clock DQ_R, a phase detecting signal PD having an inverted phase and the same frequency as compared with the phase and frequency of the first clock REF2 is generated.

However, if a front end of the feedback clock DQ_R is delayed as compared with the front end of the first clock REF2 by update, the phase detecting signal PD maintains a level of a previous time period As a result, the phase detecting signal PD has a pulse width 312a of one time period longer than a half period of the first clock REF2. Since the second phase detector 314 detects a level of the phase detecting signal PD at a front end of the feedback clock DQ_R, the second phase detector 314 generates a phase detecting signal PD_F obtained by delaying the phase detecting signal PD by one time period of the feedback clock DQ_R.

The XNOR gate 322a of the in-phase detector 322 detects in-phase intervals of two phase detecting signals PD and PD_F to output an in-phase detecting signal END. The in-phase detecting signal END represents the in-phase only at a point where the coarse lock is achieved by update. The in-phase detecting signal END represents the out-of phase at remaining intervals. That is, the in-phase interval is maintained only at a point at which the two phase detecting signals PD and PD_F are coarse-locked.

The flip-flop 322b outputs a signal, obtained by delaying an output signal of an XNOR gate 322a at a front end of the feedback clock DQ_R, as an in-phase detecting signal END_F. The in-phase detecting signal END_F is output through the signal latch unit 324 as a coarse lock signal END_STAGE.

As described above, since this example embodiment detects a phase using a first clock REF2 divided from a reference signal REF, influence of jitter is attenuated. In addition, the in-phase interval is detected, other than the state detection, so a coarse lock state can be exactly detected without failure.

Figure 12:
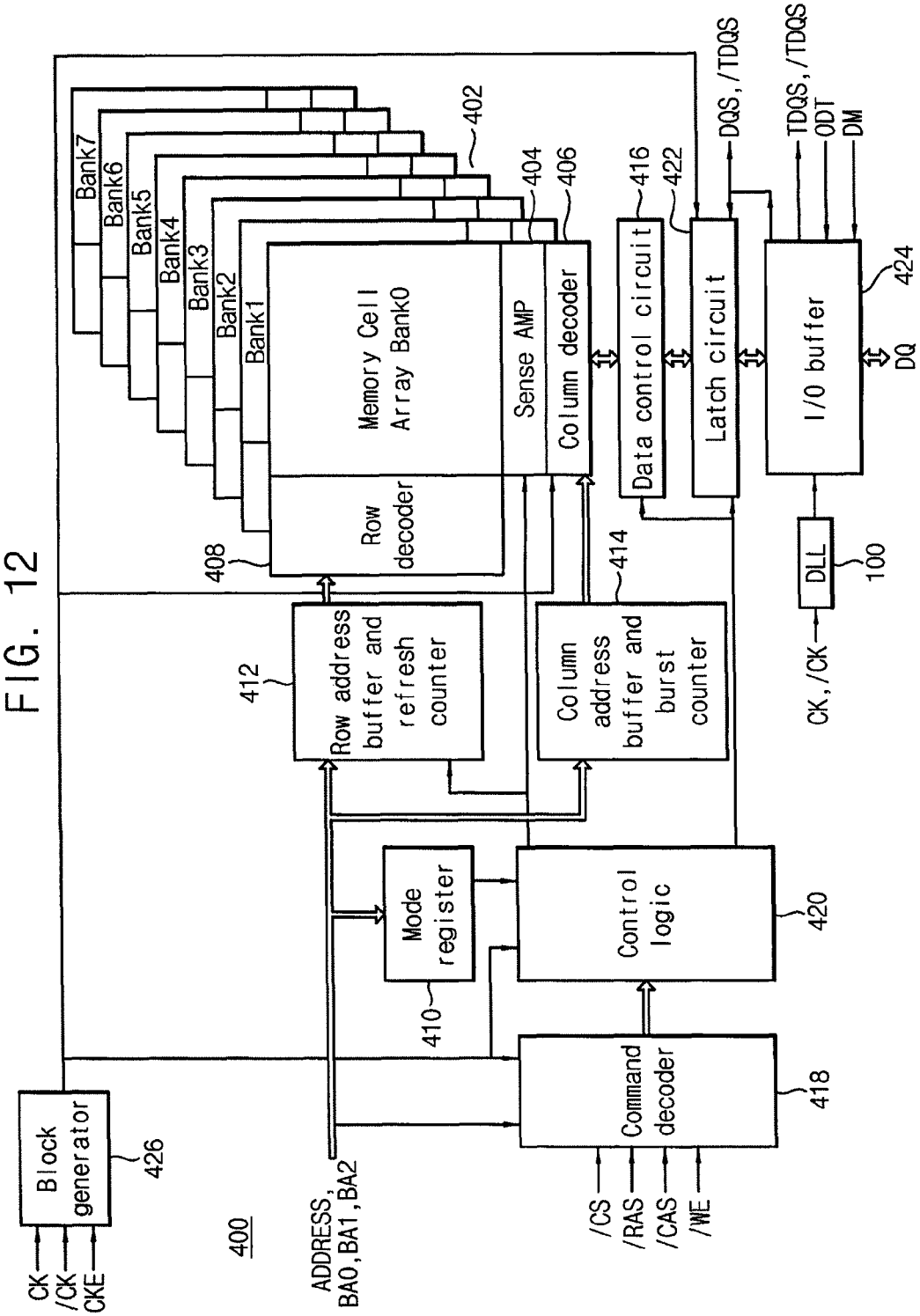
FIG. 12 illustrates an embodiment of a DDR SDRAM device with a DLL configured according to any of the aforementioned embodiments.

FIG. 12 illustrates an embodiment of a DRAM device with a DLL, which may correspond to any of the aforementioned embodiments. The DRAM device of FIG. 12 is a DDR4 (Double Date Rate 4) SDRAM (Synchronous DRAM) having 8 memory banks. The DDR4 SDRAM is an SDRAM to exchange data by synchronizing a rising edge of a clock with a falling edge of the clock.

Referring to FIG. 12, a row decoder 408 decodes a row address to drive a selected word line. A sense amplifier (AMP) 404 amplifies data read on a bit line of a memory cell array 402. During refresh, the sense amplifier 404 amplifies cell data read from the bit line accessing a cell of a word line selected by a refresh address, and writes the amplified cell data in the cell. A column decoder 406 decodes a column address to turn-on a selected Y switch so that a selected bit line is connected to an IO line.

A command decoder 418 receives a predetermined address signal, a chip address signal /CS, a row address strobe signal /RAS, a column address strobe signal /CAS, and a write enable signal /WE to decode a command.

A column address buffer and burst counter 414 generates addresses having the number corresponding to a burst length and starting from an input column address and transfers the generated address to the column decoder 406 under the control of a control logic 420 receiving a control signal from the command decoder 418.

A mode register 410 receives an address signal and bank selection signals BA0, BA1, and BA2 to output a control signal to the control logic 420. The bank selection signals are used to select one from eight banks.

A row address buffer of a row address buffer and refresh counter 412 receives an input row address and outputs the input row address to the row decoder 408. A refresh counter of a row address buffer and refresh counter 412 receives a refresh command to perform a count-up operation, and transfers a count output as a refresh address.

A row address from the row address buffer and a refresh address from the refresh counter are supplied to a multiplexer. During refresh, the refresh address is selected. Otherwise, the row address from the row address buffer is selected. The selected address is supplied to the row decoder 408.

A clock generator 426 receives external complementary clocks CK and /CK, and generates an internal clock when a clock enable signal CKE has a high level. When the clock enable signal CKE has a low level, supply of an internal clock from the clock generator 426 stops.

A data control circuit 416 inputs/outputs write data and read data. A latch circuit 422 latches write data and read data. The input/output buffer 424 inputs/outputs data at a data terminal DQ.

DLL 100 generates a delay-synchronized signal with respect to the external clocks CK and /CK and transfers the generated clocks to an input/output (I/O) buffer 424. Read data from a memory cell array 402 is transferred from the latch circuit 422 to the input/output buffer 424. The input/output buffer 424 outputs read data from the data terminal DQ as a double data rate using rising and falling edges of a clock signal synchronized with the external clock CK by the DLL 100.

DM is a data mask signal with respect to write data, which is written when the data mask signal is at a high level during write. DQS and /DQS are differential data strobe signals to regulate timings of data write and data read. The DQS and /DQS are I/O signals, that is, an input signal during write and an output signal during read. TDQS and /TDQS are differential signals to provide compatibility with an X4 data configuration of an X8 data configuration. ODT (On-DieTermination) is a control signal to turn-on/off termination resistance of DQ, DQS, /DQS, TDQS, and /TDQS.

FIG. 12 illustrates a typical example of a DDR SDRAM device which is applicable to various types of devices and devices having various configurations. Other embodiments may have a different structure.

In accordance with the aforementioned embodiments, a DLL circuit is provided which is capable of preventing coarse-lock failure due to jitter of an input clock. Such a DLL is usefully applicable, for example, to a memory system, a computer system, a server system, a communication system requiring high speed operation such as DDR4, or a network system requiring high speed signal processing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A delay-locked loop circuit, comprising:
   at least one phase detector to receive a feedback clock and a first clock to generate first and second phase detecting signals, respectively; and
   a coarse-lock detector to generate a coarse-lock signal based on changes of phase of the first and second phase detecting signals, wherein the phase changes include a change from in-phase state to an out-of phase state, and wherein the at least one phase detector includes:
   a first phase detector to generate the first phase detecting signal according to a level of the first clock at a front end of the feedback clock;
   a first delay circuit to generate a first delayed feedback signal by delaying the feedback clock for a first delay time; and
   a second phase detector to generate the second phase detecting signal according to the level of the first clock at a front end of the first delayed feedback clock.

2. The delay-locked loop circuit as claimed in claim 1, further comprising
   a divider configured to divide a reference clock by a value of N,
   wherein the first clock is generated based on the divided reference clock and wherein N is an integer equal to or greater than 1.

3. A delay-locked loop circuit, comprising:
   a phase detector to receive a feedback clock and a first clock to generate first and second phase detecting signals, respectively; and
   a coarse-lock detector to generate a coarse-lock signal based on changes of phase of the first and second phase detecting signals, wherein the phase changes include a change from in-phase state to an out-of phase state, and wherein the coarse-lock detector comprises:
   a phase change detector to detect a time point at which phases of the first and second phase detecting signals are changed from in-phase to out-of phase at a front end of a second delayed feedback signal; and
   a signal latch to generate the coarse-lock signal by latching the time point of the phase change.

4. The delay-locked loop circuit as claimed in claim 3, wherein the phase change detector comprises:
   an exclusive OR circuit that detects out-of phase intervals of the first and second phase detecting signals; and
   a D flip-flop that detects a level of an output signal of the exclusive OR circuit at the front end of a second delayed feedback signal.

5. A delay-locked loop circuit, comprising:
   a phase detector to receive a feedback clock and a first clock to generate first and second phase detecting signals, respectively; and
   a coarse-lock detector to generate a coarse-lock signal based on changes of phase of the first and second phase detecting signals, wherein the phase changes include a change from in-phase state to an out-of phase state, and wherein the phase detector comprises:
   a first phase detector to generate the first phase detecting signal according to a level of the first clock at a front end of the feedback clock; and
   a second phase detector to generate the second phase detecting signal according to a level of the first phase detecting signal at the front end of the feedback clock.

6. A delay-locked loop circuit, comprising:
   a phase detector to receive a feedback clock and a first clock to generate first and second phase detecting signals, respectively; and
   a coarse-lock detector to generate a coarse-lock signal based on changes of phase of the first and second phase detecting signals, wherein the phase changes include a change from in-phase state to an out-of phase state, and wherein the coarse lock detector comprises:
   an in-phase detector to detect whether phases of the first and second phase detecting signals are an in-phase at a front end of a feedback signal; and
   a signal latch to generate the coarse-lock signal by latching an in-phase detecting time of the in-phase detector.

7. The delay-locked loop circuit as claimed in claim 6, wherein the in-phase detector comprises:
   an exclusive NOR circuit that detects in-phase intervals of the first and second phase detecting signals; and
   a D flip-flop that detects a level of an output signal of an exclusive XOR circuit at the front end of a feedback circuit.

8. A method of controlling a delay-locked loop circuit, the method comprising:
   receiving a feedback clock and a first clock to generate first and second phase detecting signals, respectively; and
   generating a coarse-lock signal based on detecting changes of phase of the first and second phase detecting signals, wherein the changes of phase include a change from in-phase to out-of phase, wherein generating the first and second phase detecting signals comprises:
   generating the first phase detecting signal according to a level of the first clock at a front end of the feedback clock;
   generating a first delayed feedback signal by delaying the feedback clock for a first delay time; and
   generating the second phase detecting signal according to the level of the first clock at a front end of the first delayed feedback clock.

9. The method as claimed in claim 8, further comprising:
   dividing a reference clock by a value N, wherein the first clock is based on the divided reference clock and wherein N is an integer of 1 or more.

10. The method as claimed in claim 8, wherein generating the coarse-lock signal comprises:
   detecting a time point at which the phases of the first and second phase detecting signals change from in-phase to out-of phase at a front end of a second delayed feedback signal; and
   generating the coarse-lock signal by latching the time point of the changes of phase.

11. The method as claimed in claim 10, wherein detecting the time point comprises:
   detecting out-of phase intervals of the first and second phase detecting signals; and
   detecting a level of an output signal of an exclusive OR circuit at the front end of a second delayed feedback signal.

12. A method of controlling a delay-locked loop circuit, the method comprising:
   receiving a feedback clock and a first clock to generate first and second phase detecting signals, respectively; and
   generating a coarse-lock signal based on detecting changes of phase of the first and second phase detecting signals, wherein the changes of phase include a change from in-phase to out-of phase, and wherein generating the first and second phase detecting signals comprises:
   generating the first phase detecting signal according to a level of the first clock at a front end of the feedback clock; and
   generating the second phase detecting signal according to a level of the first phase detecting signal at the front end of the feedback clock.

13. A method of controlling a delay-locked loop circuit, the method comprising:
   receiving a feedback clock and a first clock to generate first and second phase detecting signals, respectively; and
   generating a coarse-lock signal based on detecting changes of phase of the first and second phase detecting signals, wherein the changes of phase include a change from in-phase to out-of phase, and wherein generating the coarse-lock signal comprises:
   detecting whether phases of the first and second phase detecting signals are in-phase at a front end of a feedback signal; and
   generating the coarse-lock signal by latching an in-phase detecting time.

14. A delay-locked loop circuit, comprising:
   a phase detector to generate a first signal and a second signal based on a divided reference clock signal and a third signal based on a feedback clock signal, the first signal to be generated at a time different from the second signal;
   a delay circuit to delay the feedback clock signal at least once; and
   a coarse-lock detector to generate a coarse-lock signal based on the first and second signals and the delayed feedback clock signal relative to a timing of the divided reference clock signal.

15. The delay-locked loop circuit as claimed in claim 14, wherein the coarse-lock detector generates the coarse-lock signal based on changes of phase of the first and second signals.

16. The delay-locked loop circuit as claimed in claim 15, wherein the changes of phase correspond to a change from in-phase state to out-of phase state.

17. The delay-locked loop circuit as claimed in claim 14, wherein the phase detector includes:
   a first flip-flop having an input coupled to receive the divided reference clock signal, the first flip-flop to output the first signal based on the feedback clock signal; and
   a second flip-flop having an input coupled to receive the divided reference clock signal, the second flip-flop to output the second signal based on the delayed feedback clock signal.

18. The delay-locked loop circuit as claimed in claim 14, wherein:
   the delay circuit delays the delayed feedback clock signal; and
   the coarse-lock detector generates the coarse-lock signal based on a timing that corresponds to an output of the delay circuit.

* * * * *